United States Patent
Sreenivasan (10) Patent No.: US 7,105,452 B2
(45) Date of Patent: Sep. 12, 2006

(54) METHOD OF PLANARIZING A SEMICONDUCTOR SUBSTRATE WITH AN ETCHING CHEMISTRY

(75) Inventor: Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 53 days.

(21) Appl. No.: 10/917,563

(22) Filed: Aug. 13, 2004

(65) Prior Publication Data
US 2006/0035464 A1    Feb. 16, 2006

(51) Int. Cl.
*H01L 21/311* (2006.01)

(52) U.S. Cl. ........... 438/697; 438/781; 438/693; 438/694; 257/E21.58; 257/E21.576; 216/38

(58) Field of Classification Search ............. 216/38; 438/780, 781, 690–693, 694, 697, 705; 257/E21.58, 257/E21.576
See application file for complete search history.

(56) References Cited

U.S. PATENT DOCUMENTS

| | | |
|---|---|---|
| 4,070,116 A | 1/1978 | Frosch et al. |
| 4,512,848 A | 4/1985 | Deckman et al. |
| 4,552,832 A | 11/1985 | Blume et al. |
| 4,707,218 A | 11/1987 | Giammarco et al. |
| 4,731,155 A | 3/1988 | Napoli et al. |
| 4,737,425 A | 4/1988 | Lin et al. |
| 4,909,151 A | 3/1990 | Fukui et al. |
| 4,959,252 A | 9/1990 | Bonnebat et al. |
| 5,028,366 A | 7/1991 | Harakal et al. |
| 5,151,754 A | 9/1992 | Ishibashi et al. |
| 5,240,550 A | 8/1993 | Boehnke et al. |
| 5,246,880 A | 9/1993 | Reele et al. |
| 5,425,848 A | 6/1995 | Haisma et al. |
| 5,451,435 A * | 9/1995 | Yu ............................ 427/585 |
| 5,480,047 A | 1/1996 | Tanigawa et al. |
| 5,545,367 A | 8/1996 | Bae et al. |
| 5,601,641 A | 2/1997 | Stephens |
| 5,654,238 A | 8/1997 | Cronin et al. |
| 5,736,424 A * | 4/1998 | Prybyla et al. ............. 438/780 |
| 5,772,905 A | 6/1998 | Chou |
| 5,849,209 A | 12/1998 | Kindt-Larsen et al. |
| 5,849,222 A | 12/1998 | Jen et al. |
| 5,888,650 A | 3/1999 | Calhoun et al. |
| 6,046,056 A | 4/2000 | Parce et al. |
| 6,048,799 A | 4/2000 | Prybyla |
| 6,074,827 A | 6/2000 | Nelson et al. |
| 6,218,316 B1 | 4/2001 | Marsh |
| 6,309,580 B1 | 10/2001 | Chou |

(Continued)

FOREIGN PATENT DOCUMENTS

FR       2677043 A1 * 12/1992

(Continued)

OTHER PUBLICATIONS

U.S. Appl. No. 10/897,734, filed Jul. 23, 2004, Watts et al.

(Continued)

*Primary Examiner*—George R. Fourson
*Assistant Examiner*—Thanh V. Pham
(74) *Attorney, Agent, or Firm*—Michael D. Carter (57) ABSTRACT

The present invention provides a method of planarizing a substrate, the method including, forming, on the substrate, a patterned layer having a first shape associated therewith; and processing the patterned layer, with the first shape compensating for variations in the processing such that upon processing the patterned layer, the patterned layer comprises a substantially planar shape.

33 Claims, 9 Drawing Sheets

U.S. PATENT DOCUMENTS

| | | |
|---|---|---|
| 6,326,627 B1 | 12/2001 | Putvinski et al. |
| 6,334,960 B1 | 1/2002 | Willson et al. |
| 6,391,217 B1 | 5/2002 | Schaffer et al. |
| 6,482,742 B1 | 11/2002 | Chou |
| 6,503,829 B1 | 1/2003 | Kim et al. |
| 6,517,977 B1 | 2/2003 | Resnick et al. |
| 6,517,995 B1 | 2/2003 | Jacobenson et al. |
| 6,518,189 B1 | 2/2003 | Chou |
| 6,580,172 B1 | 6/2003 | Mancini et al. |
| 6,646,662 B1 | 11/2003 | Nebashi et al. |
| 6,696,220 B1 | 2/2004 | Bailey et al. |
| 6,713,238 B1 | 3/2004 | Chou et al. |
| 6,719,915 B1 | 4/2004 | Willson et al. |
| 6,776,094 B1 | 8/2004 | Whitesides et al. |
| 6,809,356 B1 | 10/2004 | Chou |
| 6,828,244 B1 | 12/2004 | Chou |
| 6,870,301 B1 | 3/2005 | Choi et al. |
| 2002/0042027 A1 | 4/2002 | Chou et al. |
| 2002/0094496 A1 | 7/2002 | Choi et al. |
| 2002/0132482 A1 | 9/2002 | Chou |
| 2002/0167117 A1 | 11/2002 | Chou |
| 2002/0177319 A1 | 11/2002 | Chou |
| 2003/0034329 A1 | 2/2003 | Chou |
| 2003/0080471 A1 | 5/2003 | Chou |
| 2003/0080472 A1 | 5/2003 | Chou |
| 2004/0007799 A1 | 1/2004 | Choi et al. |
| 2004/0008334 A1 | 1/2004 | Sreenivasan et al. |
| 2004/0009673 A1 | 1/2004 | Sreenivasan et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0036201 A1 | 2/2004 | Chou et al. |
| 2004/0038552 A1 | 2/2004 | Watts et al. |
| 2004/0046288 A1 | 3/2004 | Chou |
| 2004/0065252 A1 | 4/2004 | Sreenivasan et al. |
| 2004/0110856 A1 | 6/2004 | Young et al. |
| 2004/0118809 A1 | 6/2004 | Chou et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0156108 A1 | 8/2004 | Chou et al. |
| 2004/0192041 A1 | 9/2004 | Jeong et al. |
| 2004/0197843 A1 | 10/2004 | Chou et al. |

FOREIGN PATENT DOCUMENTS

| | | |
|---|---|---|
| JP | 58-129074 | 8/1983 |
| JP | 02-24848 | 1/1990 |
| JP | 02-92603 | 4/1990 |
| JP | 4-70379 | 5/1992 |
| WO | WO 99/05724 | 2/1999 |
| WO | WO 00/21689 | 4/2000 |
| WO | WO 01/47003 | 6/2001 |
| WO | WO 02/07199 | 1/2002 |
| WO | WO 03/010289 | 2/2003 |
| WO | WO 03/079416 | 9/2003 |
| WO | WO 03/099536 | 12/2003 |
| WO | WO 2004/114016 | 12/2004 |

OTHER PUBLICATIONS

U.S. Appl. No. 10/951,014, filed Sep. 27, 2004, Sreenivasan et al.

Chou, Nanoimprint Lithography and Lithographically Induced Self-Assembly, MRS Bulletin, pp. 512-517, Jul. 1, 2001.

Choi et al., Design of Orientation Stages for Step and Flash Imprint Lithography, Precision Engineering, pp. 192-199, Jan. 1, 2001.

Colburn et al., Step and Flash Imprint Lithography for sub-100 nm Patterning, Proceedings of SPIE vol. 3997, pp. 453-457, Jan. 1, 2000.

Chou et al., Imprint Lithography with 25-Nanometer Resolution, Science vol. 272, pp. 85-87, Apr. 5, 1996.

Chou et al., Imprint Lithography with Sub-10 nm Feature Size and High Throughput, Microelectronic Engineering 35, pp. 237-240, Jan. 1, 1997.

Haisma et al., Mold-assisted Nanolithography: A Process for Reliable Pattern Replication, J. Vac. Sci. Technol. B, pp. 4124-4128, Nov. 1, 1996.

Chou et al., Imprint of Sub-25 nm Vias and Trenches in Polymers, Appl. Phys. Lett. 67 (21), Nov. 20, 1995.

Johnson et al., Advances in Step and Flash Imprint Lithography, SPIE Microlithography Conference, Feb. 23, 2003.

Chou et al., Lithographically Induced Self-assembly of Periodic Polymer Micropillar Arrays, J. Vac. Sci. Technol. B 17 (6), pp. 3197-3202, Nov. 1, 1999.

Colburn et al., Step and Flash Imprint Lithography: A New Approach to High-Resolution Patterning, Proc. Of SPIE, vol. 3676, Mar. 1, 1999.

Abstract of Japanese Patent 58-129074.

Heidari, Nanoimprint Lithography at the 6 in. Wafer Scale, J. Vac. Sci. Technol. B 18(6), pp. 3557-3560, Nov. 1, 2000.

Translation of Japanese Patent 02-92603.

Translation of Japanese Patent 02-24848.

Chou et al., Ultrafast and Direct Imprint of Nanostructures in Silicon, Nature, col. 417, (Jun. 2002), pp. 835-837, Jun. 1, 2002.

Chou et al., Nanoimprint Lithography, Journal of Vacuum Science Technology B 14(16), pp. 4129-4133, Nov. 1, 1996.

Colburn et al., Development and Advantages of Step-and-Flash Lithography, Solid State Technology, Jul. 1, 2001.

Colburn et al., Characterization and Modeling of Volumetric and Mechanical Properties for Step and Flash Imprint Lithography Photopolymers, Journal of Vacuum Science Technology. vol. b. 19(6), Nov. 1, 2001.

Bailey et al., Step and Flash Imprint Lithography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), pp. 3572-3577, Nov. 1, 2000.

Schneider et al., Stripes of Partially Fluorinated Alkyl Chains: Dipolar Langmuir Monolayers.

* cited by examiner

METHOD OF PLANARIZING A SEMICONDUCTOR SUBSTRATE WITH AN ETCHING CHEMISTRY

BACKGROUND OF THE INVENTION

The field of invention relates generally to semiconductor device processing. More particularly, the present invention is directed to a method of planarizing the surface of a semiconductor substrate.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

As the minimum feature size of structures formed on substrates is reduced, there is an increasing desire to form a substrate having a substantially planar surface. A method of planarizing a substrate is disclosed in U.S. Pat. No. 5,736, 424 to Prybyla et al. Prybyla et al. describes a method of planarizing a nonplanar surface by coating the nonplanar surface with a material having a viscosity of less than 1000 centipose, contacting the material with an object having a flat surface in such a manner that the material is planarized to a desired degree, curing the material while in contact with the object, and then separating the object.

Another method of planarizing a substrate is disclosed in U.S. Pat. No. 6,218,316 to Marsh. Marsh describes a method of planarizing a substrate having a planarization material disposed thereon. Specifically, a substantially flat surface is brought into contact with the planarization material on the substrate; the planarization material is then exposed to radiation at a first wavelength of light to cure the planarization material and exposed to radiation at a second wavelength of light to facilitate separation of the substantially flat surface from the planarization material.

It is desired, therefore, to provide an improved method of planarizing a substrate.

SUMMARY OF THE INVENTION

The present invention provides a method of planarizing a substrate, the method including, forming, on the substrate, a patterned layer having a first shape associated therewith; and processing the patterned layer, with the first shape compensating for variations in the processing such that upon processing the patterned layer, the patterned layer comprises a substantially planar shape. These embodiments and others are described more fully below.

DETAILED DESCRIPTION OF THE INVENTION

Figure 1:
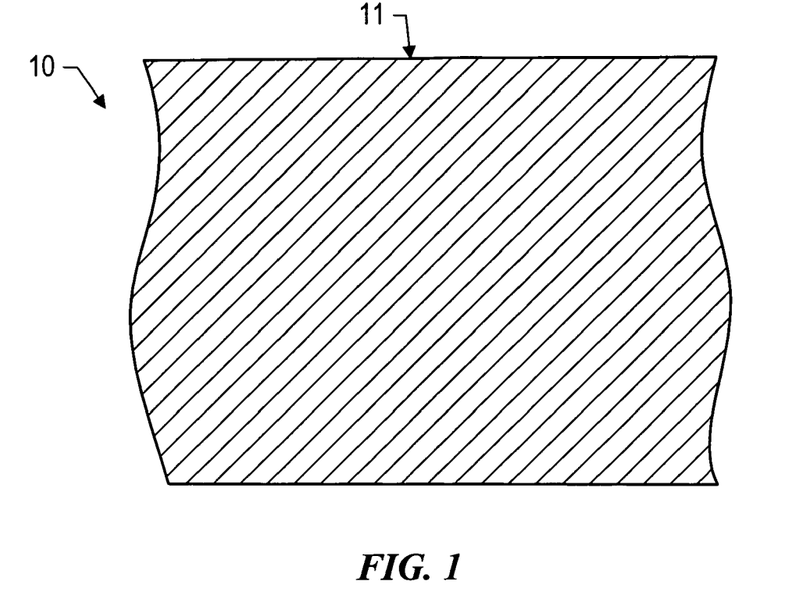
FIG. 1 is a simplified elevation view of a substrate prior to exposure to an etching process.

Referring to FIG. 1, a substrate 10 is shown prior to exposure to an etching process having an etching chemistry associated therewith, wherein the etching process may be a wet or a plasma etching process, described further below. Substrate 10 may be formed from materials including, but not limited to, silicon, gallium arsenide, quartz, fused-silica, sapphire, organic polymers, siloxane polymers, borosilicate glass, fluorocarbon polymers or a combination thereof. Surface 11 of substrate 10 may comprise the material from which substrate 10 is formed or may consist of such material including, but not limited to, conductive materials, dielectric materials, and photoresist. Surface 11 is shown comprising a pattern that is substantially planar; however, surface 11 may be substantially non-planar.

Figure 2:
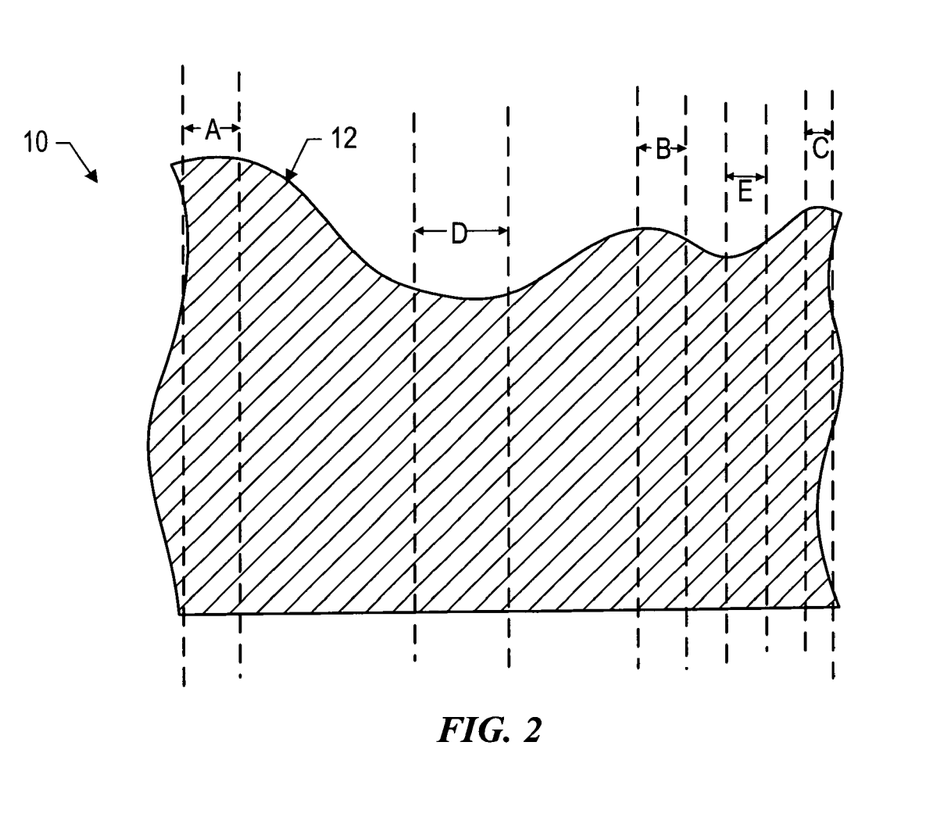
FIG. 2 is a simplified elevation view of a substrate subsequent to exposure to an etching process.

Referring to FIG. 2, substrate 10 is shown subsequent to exposure to the aforementioned etching process. As a result, surface 11, shown in FIG. 1, transforms to form a surface 12 on substrate 10. Surface 12 of substrate 10 comprises a profile, defined as the etch signature, that is substantially non-planar, which is undesirable. This is a result of the etching process having an etch uniformity that is not constant throughout the etching tool/process. Etch uniformity is defined as a property of an etching tool/process wherein the etch rate associated with the etching tool/process is uniform across a wafer or from wafer to wafer. However, in some instances, etch uniformity may not be obtained within an etching tool/process, and as a result, inconsistencies in the etch uniformity may arise. Inconsistencies in the etch uniformity of the etching tool/process may be a result of depletion effects of the gas flows, depletion of etchant species that occur as the material is being etched away, and local variations in the surface 11, shown in FIG. 1, of substrate 10. Therefore, to minimize, if not prevent, forming surface 12 of substrate 10, and thus, a substantially non-planar etch signature, a template 14, shown in FIG. 3, is utilized, described further below.

Figure 3:
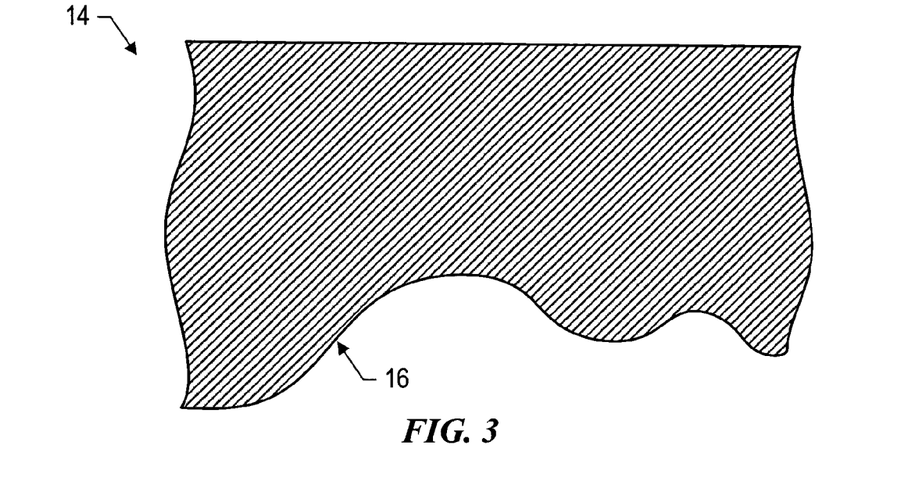
FIG. 3 is a simplified elevation view of a template after exposure to the etching process of the substrate, shown in FIG. 1.

Referring to FIGS. 2 and 3, as a result of subjecting substrate 10 to the aforementioned etching process, surface 12 of substrate 10 may be substantially non-planar. Substrate 10 comprises a plurality of regions; however, for simplicity only regions A, B, C, D, and E are shown, wherein regions A, B, C, D, and E each have an etch rate associated therewith. More specifically, region A has a first etch rate associated therewith; region B has a second etch rate associated; region C has a third etch rate associated; region D has a fourth etch rate associated therewith; and region E has a fifth etch rate associated therewith. The first, second, third, fourth, and fifth etch rates may be of differing magnitudes, and as a result, regions A, B, C, D, and E represent a non-planar etch signature of substrate 10. Furthermore, regions A, B, C, D, and E of substrate 10 may be associated with differing regions of an etching chamber (not shown) having the aforementioned differing etch rates associated therewith, with substrate 10 being placed within the etching chamber (not shown) and the etching chamber (not shown) providing an environment of the etching process. The differing etch rates associated with regions A, B, C, D, and E are a result of the etch non-uniformity of the aforementioned etching process. However, a priori knowledge of the differing etch rates of the regions A, B, C, D, and E of the etching chamber (not shown) may be beneficial in that a template 14 may be formed to compensate for such differing etch rates of regions A, B, C, D, and E of the etching chamber (not shown) such that surface 12 of substrate 10 may comprise a substantially planar etch signature after exposure to the etching process. More specifically, a surface 16 of template 14 is formed to have an etch signature that is substantially the same as the etch signature of surface 12 of substrate 10. To form substantially the same etch signature as surface 12 of substrate 10 on template 14, template 14 may be subjected to substantially the same etching process, and more specifically, template 14 may be placed in the same etching chamber (not shown) as substrate 10 is placed in such that template 14 is subjected to the differing etch rates associated with regions A, B, C, D, and E of the etching chamber (not shown). To that end, the differing etch rates associated with regions A, B, C, D, and E of the etching chamber (not shown) form regions F, G, H, I, and J, respectively on template 14. As a result, surface 16 of template 14 will have substantially the same etch signature as surface 12 of substrate 10.

Figure 4:
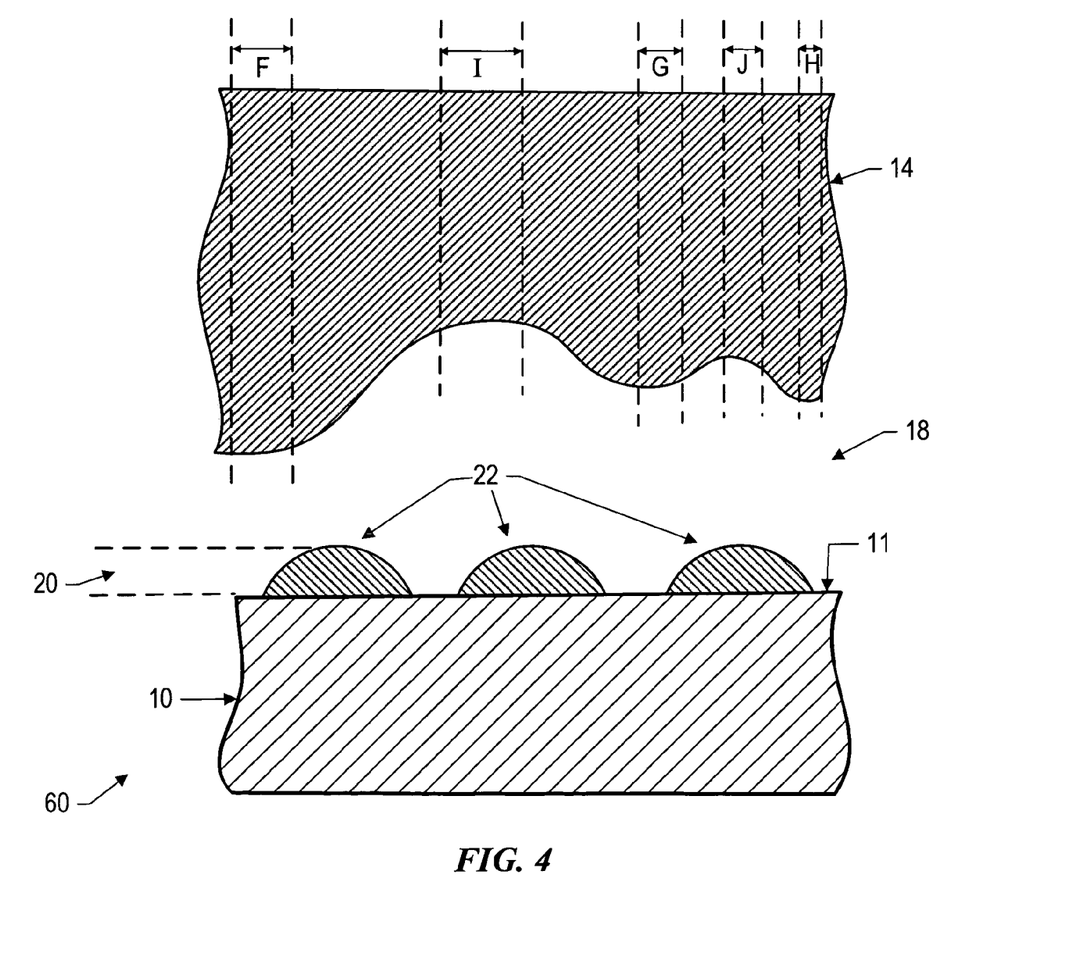
FIG. 4 is a simplified elevation view of the template prior to contact with an imprinting layer of a multi-layered structure.
Figure 5:
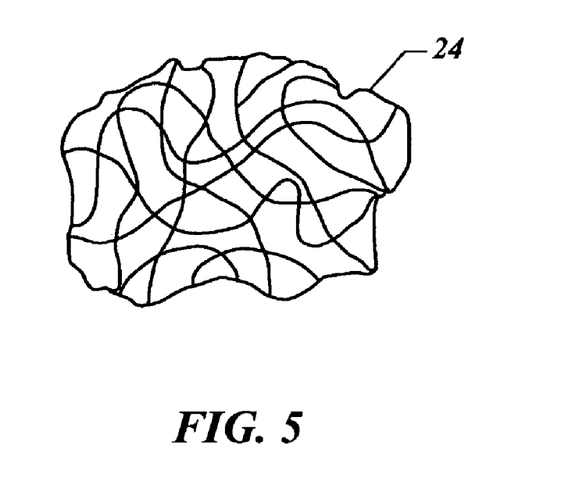
FIG. 5 is a simplified representation of material from which the imprinting layer, shown in FIG. 4, is comprised before being polymerized and cross-linked.
Figure 6:
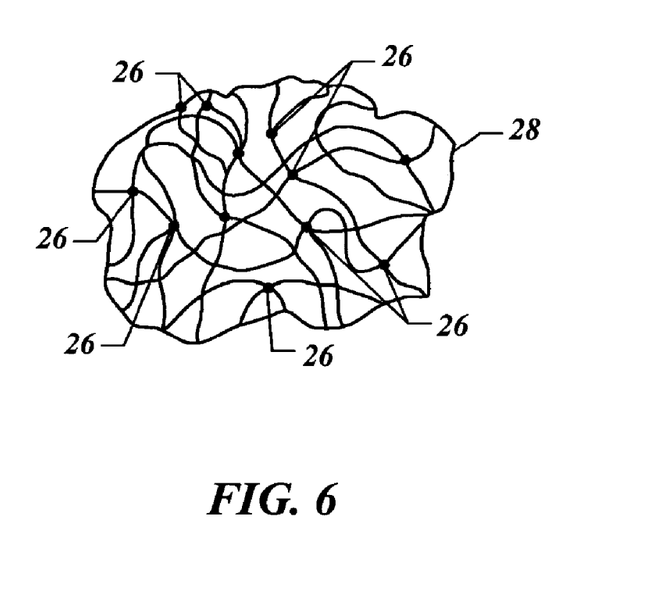
FIG. 6 is a simplified representation of cross-linked polymer material into which the material shown in FIG. 5 is transformed after being subjected to radiation.

Referring to FIGS. 4 and 5, template 14 is shown spaced-apart from substrate 10 defining a gap 18 therebetween. Substrate 10 is shown comprising surface 11, and thus, substrate 10 is shown prior to exposure to the aforementioned etching process. Disposed upon surface 11 of substrate 10 is an planarization layer 20, with substrate 10 and planarization layer 20 forming a multi-layered structure 60. Planarization layer 20 may be deposited upon surface 11 of substrate 10 in a plurality of methods including, but not limited to, chemical vapor deposition (CVD), physical vapor deposition (PVD), sputter deposition, spin-coating, and dispensing of a liquid. In the present embodiment, planarization layer 20 is deposited upon substrate 10 as a plurality of spaced-apart droplets 22 comprising a material 24. An exemplary composition for material 24 is disclosed in U.S. patent application Ser. No. 10/463,396, filed Jun. 16, 2003 and entitled "Method to Reduce Adhesion between a Conformable Region and a Pattern of a Mold," which is incorporated by reference in its entirety herein. Material 24 is shown in FIG. 6 as being cross-linked at points 26, forming a cross-linked polymer material 28. In a further embodiment, material 24 may have a viscosity of less than about 15 centipose.

Figure 7:
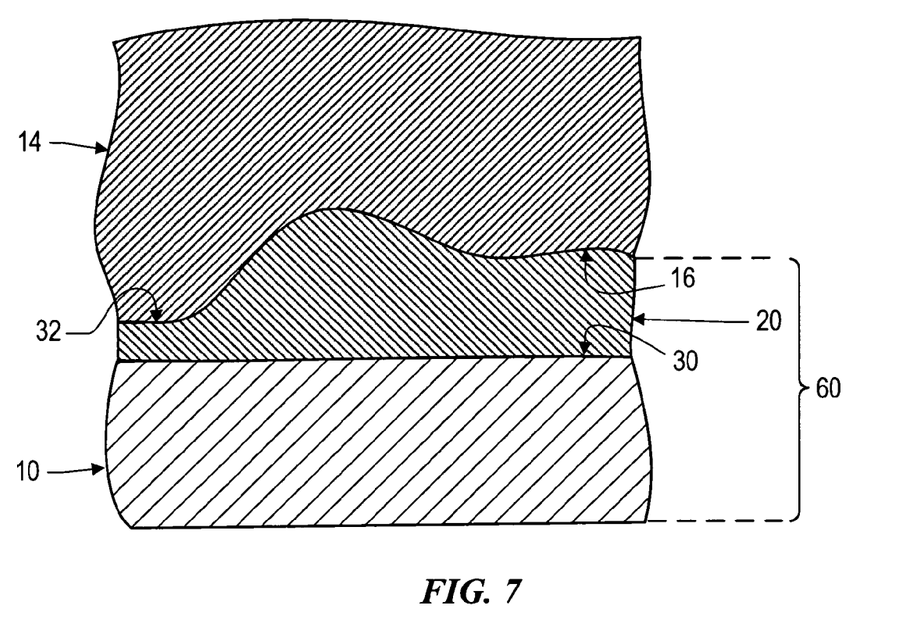
FIG. 7 is a simplified elevation view of the template in contact with the imprinting material of the multi-layered structure.

Referring to FIGS. 4, 6, and 7, gap 18 is reduced such that droplets 22 come into mechanical contact with template 14, spreading droplets 22 so as to form planarization layer 20 with a contiguous formation of material 24, shown in FIG. 5, over surface 11. After the gap 18 is reduced, radiation is impinged upon material 24, shown in FIG. 5, to polymerize and cross-link the same, forming cross-linked polymer material 28. As a result, the composition of planarization layer 20 transforms from material 24, shown in FIG. 5, to cross-linked polymer material 28, which is a solid. The radiation impinged upon material 28 may be, ultraviolet, thermal, electromagnetic, visible light, heat, and the like. The selection of radiation employed to initiate the polymerization of material 28 is known to one skilled in the art and typically depends on the specific application which is desired. Specifically, cross-linked polymer material 28 is solidified to provide side 32 of planarization layer 20 with a shape conforming to a shape of surface 16 of template 14. After planarization layer 20 is transformed to consist of cross-linked polymer material 28, gap 18 is increased such that template 14 and multi-layered structure 60 are spaced-apart, as shown in FIG. 8, wherein a surface 34 of multi-layered structure 60 is the inverse of surface 16 of template 14.

Figure 8:
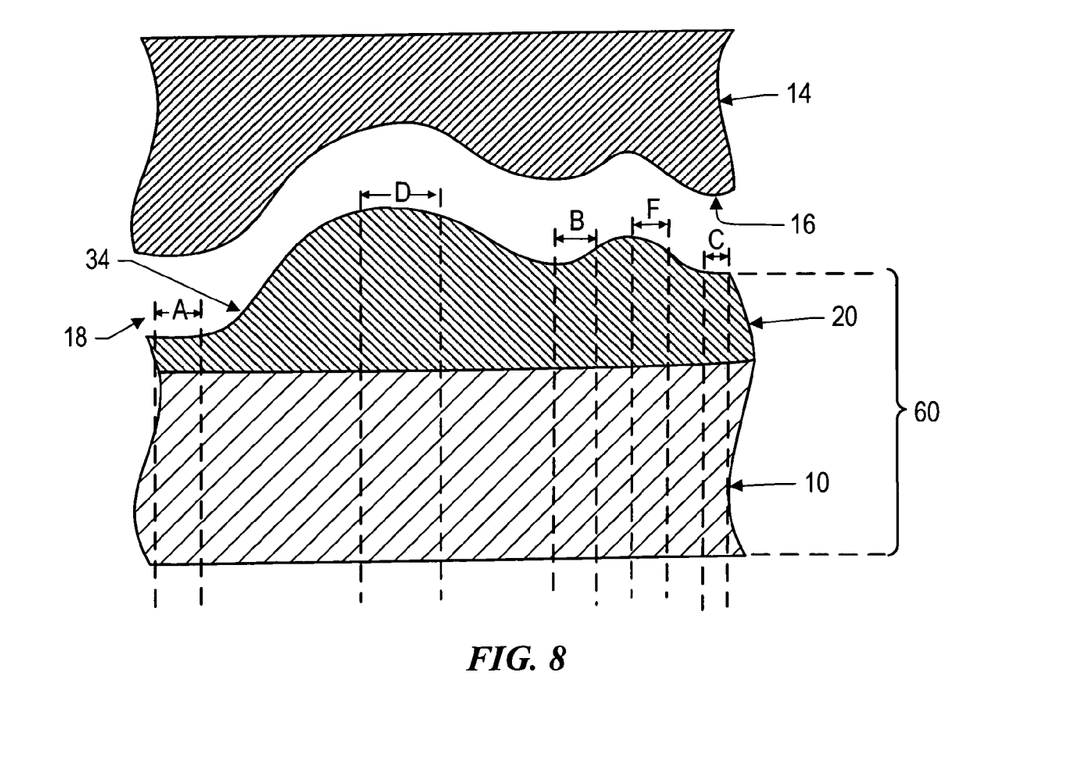
FIG. 8 is a simplified elevation view of the template spaced-apart from the multi-layered structure after patterning of the imprinting material.

Referring to FIGS. 4 and 8, to properly form surface 34 of multi-layered structure 60, proper alignment of template 14 with respect to multi-layered structure 60 is needed. Ascertaining a proper alignment between template 14 and multi-layered structure 60 facilitates in forming a desired etch signature in multi-layered structure 60 that compensates for differing etch rates within the differing regions of the etching chamber (not shown). To properly align template 14 with multi-layered structure 60, regions F, G, H, I, and J of template 14 should be placed in superimposition with regions A, B, C, D, and E of substrate 10, respectively. Furthermore, proper alignment of template 14 with respect to the etching tool coordinates may be desired.

Figure 9:
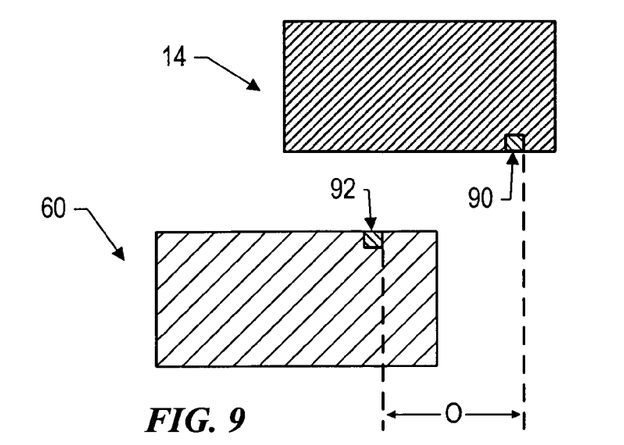
FIG. 9 is a simplified elevation view of the template in superimposition with the multi-layered structure showing misalignment along one direction.
Figure 10:
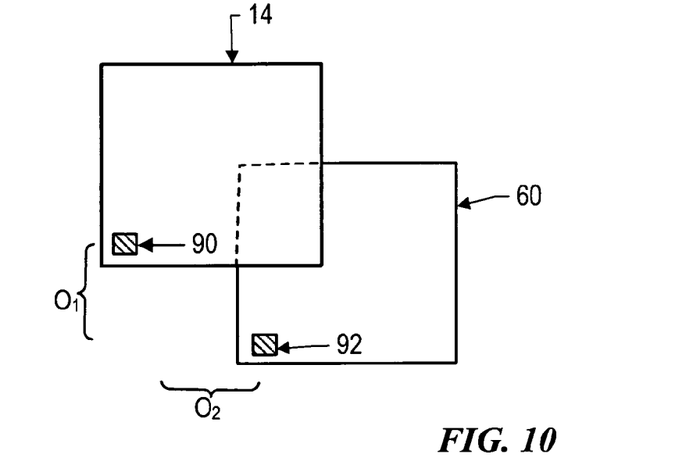
FIG. 10 is a top down view of the template and the multi-layered structure showing misalignment along two transverse directions.
Figure 11:
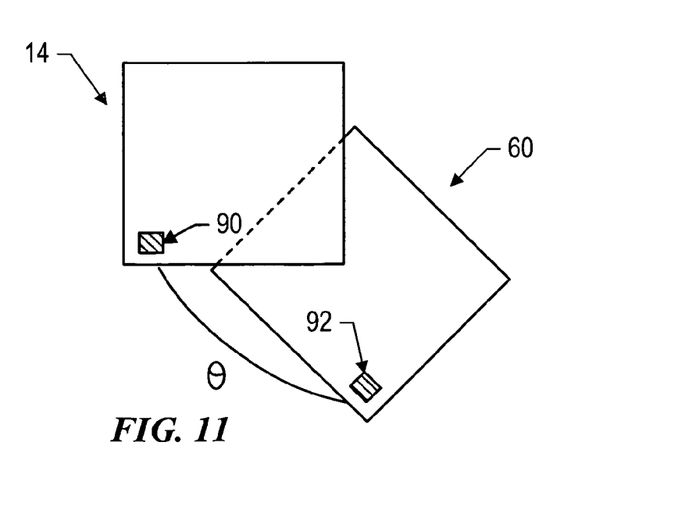
FIG. 11 is a top down view of the template and the multi-layered structure showing angular misalignment.

Referring to FIGS. 9 and 10, to facilitate the above-mentioned alignment of template 14 and multi-layered structure 60 and/or the etching tool coordinates, template 14 may include template alignment marks, one of which is shown as 90, and multi-layered structure 60 may include multi-layered structure alignment marks, one of which is shown as 92. In the present example, it is assumed that desired alignment between template 14 and multi-layered structure 60 occurs upon template alignment mark 90 being in superimposition with multi-layered structure alignment mark 92. As shown in FIG. 9, desired alignment between template 14 and multi-layered structure 60 has not occurred, shown by the two marks being offset a distance O. Further, although offset O is shown as being a linear offset in one direction, it should be understood that the offset may be linear along two direction shown as $O_1$ and $O_2$, as shown in FIG. 10. In addition to, or instead of, the aforementioned linear offset in one or two directions, the offset between template 14 and multi-layered structure 60 may also consist of an angular offset, shown in FIG. 11 as angle $\Theta$. An exemplary embodiment for alignment marks 90 and 92 is disclosed in U.S. Pat. No. 5,414,514 entitled "On-Axis Interferometric Alignment of Plates using the Spatial Phase of Interference Patterns," and U.S. Pat. No. 5,808,742 entitled "Optical Alignment Apparatus having Multiple Parallel Alignment Marks."

Figure 12:
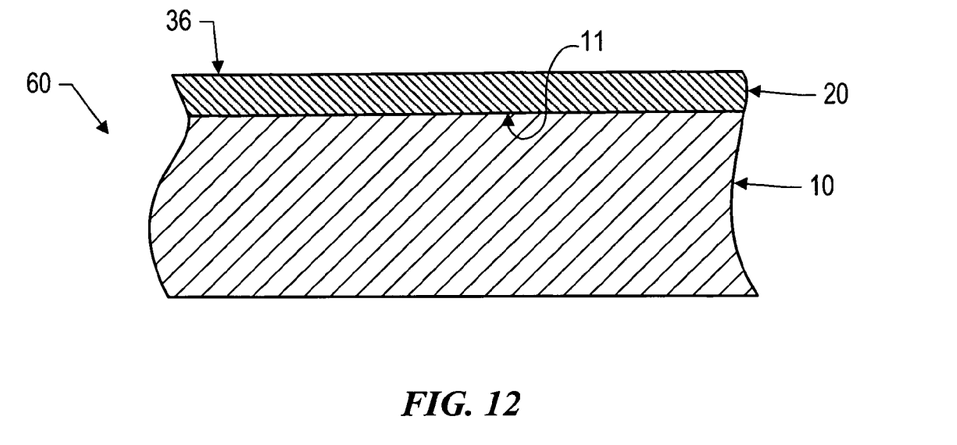
FIG. 12 is a simplified elevation view of the imprinting layer after exposure to an etching process.

Referring to FIGS. 8 and 12, after increasing gap 18 such that template 14 and multi-layered structure 60 are spaced-apart, multi-layered structure 60 is subjected to the aforementioned etching process, and more specifically, planarization layer 20 is subjected to the differing etch rates within the differing regions of the etching chamber (not shown). To that end, planarization layer 20 is subjected to the first etch rate associated with region A of the etching chamber (not shown); the second etch rate associated with region B of the etching chamber (not shown); the third etch rate associated with region C of the etching chamber (not shown); the fourth etch rate associated with region D of the etching chamber (not shown); and the fifth etch rate associated with region E of the etch chamber (not shown). However, by having a pattern that is complimentary to surface 16 of template 14, planarization layer 20 is able to compensate for such differing etch rates by having a varied thickness across surface 34. For example, the fourth etch rate associated with region D may be greater than the second etch rate associated with region B. Therefore, to produce surface 34 with a substantially planar etch signature and form surface 36, shown more clearly in FIG. 12, the thickness of planarization layer 20 associated with region D may be greater than the thickness of planarization layer 20 associated with region B, and as a result, the difference in the etch rates associated with regions B and D is compensated for. In another example, the second etch rate associated with region B may be greater than the first etch rate associated with region A. Therefore, to produce surface 34 with a substantially planar etch signature and form surface 36, shown more clearly in FIG. 12, the thickness of planarization layer 20 associated with region B may be greater than the thickness of planarization layer 20 associated with region A, and as a result, the difference in the etch rates associated with regions A and B is compensated for. To that end, the thickness of planarization layer 20 associated with each of regions A, B, C, D, and E is formed such that when exposed to the respective etch rate associated therewith, surface 34 of multi-layered structure 60 is made to have a substantially planar etch signature, forming surface 36, shown more clearly FIG. 12, which is desired.

Figure 13:
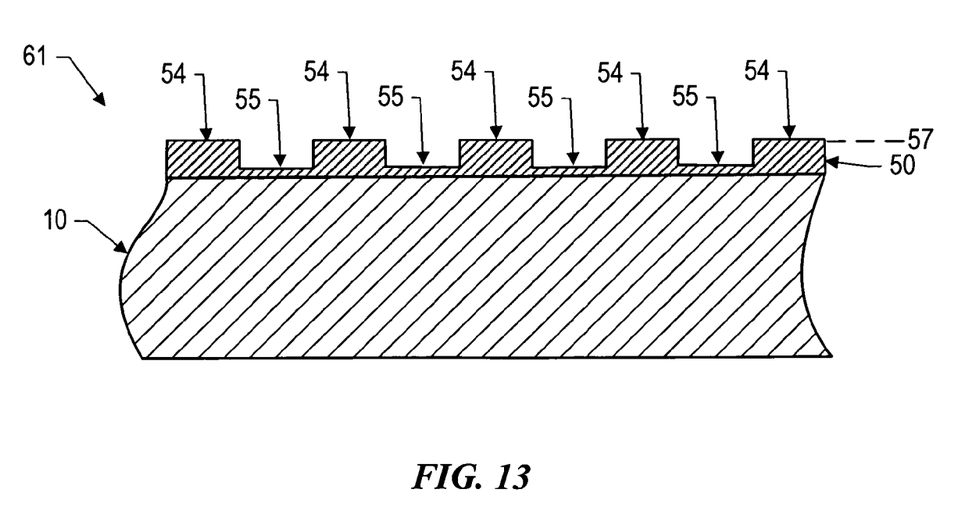
FIG. 13 is a simplified elevation view of a second multi-layered structure comprising a substrate and a patterned layer.
Figure 14:
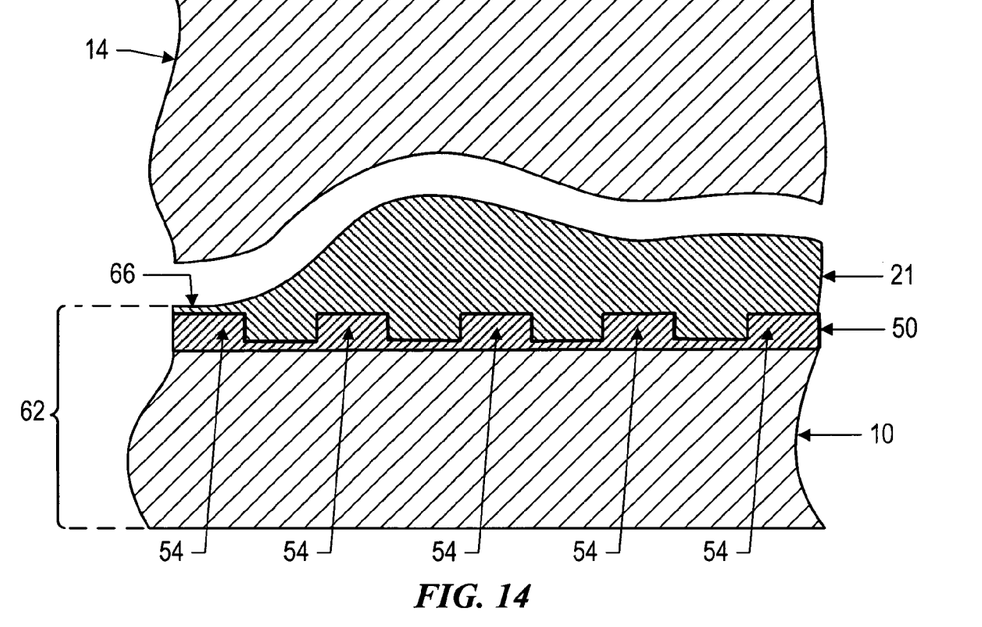
FIG. 14 is a simplified elevation view of the second multi-layered structure having an imprinting layer disposed thereon forming a third multi-layered structure, with the third multi-layered structure being spaced-apart from a template.

Referring to FIGS. 13 and 14, in a further embodiment, a multi-layered structure 61 is shown having substrate 10 and a patterned layer 50. Patterned layer 50 may comprise protrusions 54 and recesses 55 forming a pattern on surface 57 of multi-layered structure 61. The pattern on surface 57 of patterned layer 50 may be formed by such techniques including, but not limited to, photolithography, e-beam lithography, x-ray lithography, ion beam lithography, and imprint lithography. Imprint lithography is described in detail in numerous publications, such as United States published patent applications 2004/0065976, entitled "Method and a Mold to Arrange Features on a Substrate to Replicate Features having Minimal Dimensional Variability"; 2004/0065252, entitled "Method of Forming a Layer on a Substrate to Facilitate Fabrication of Metrology Standards"; 2004/0046271, entitled "Method and a Mold to Arrange Features on a Substrate to Replicate Features having Minimal Dimensional Variability", all of which are assigned to the assignee of the present invention. An exemplary lithographic system utilized in imprint lithography is available under the trade name IMPRIO 100™ from Molecular Imprints, Inc., having a place of business at 1807-C Braker Lane, Suite 100, Austin, Tex. 78758. The system description for the IMPRIO 100™ is available at www.molecularimprints.com and is incorporated herein by reference. A planarization layer 21 may be disposed upon patterned layer 50, forming multi-layered structure 62, shown more clearly in FIG. 14. Planarization layer 21 may deposited upon patterned layer 50 in any of the methods as described above with respect to planarization layer 20, shown in FIG. 4, and may be formed from any of the materials as described above with respect to planarization layer 20, shown in FIG. 4.

Figure 15:
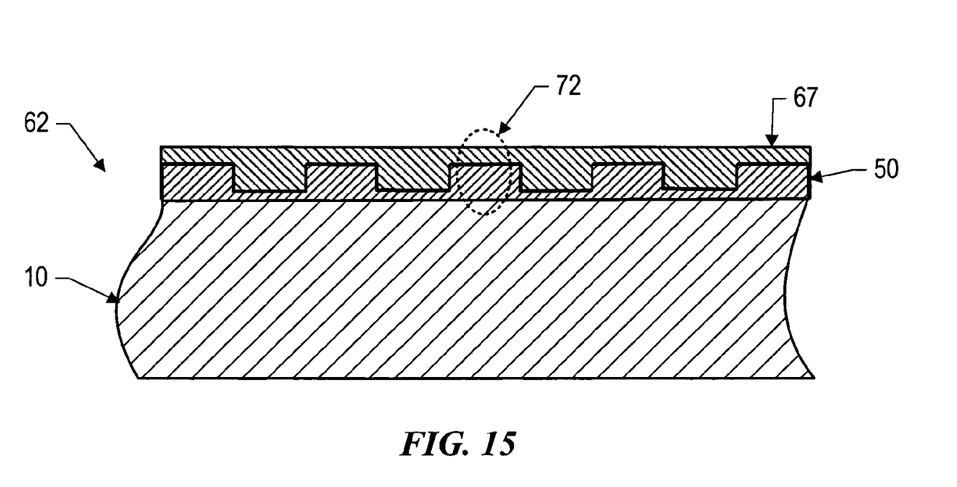
FIG. 15 is a simplified elevation view the third multi-layered structure after exposure to the etching process.
Figure 16:
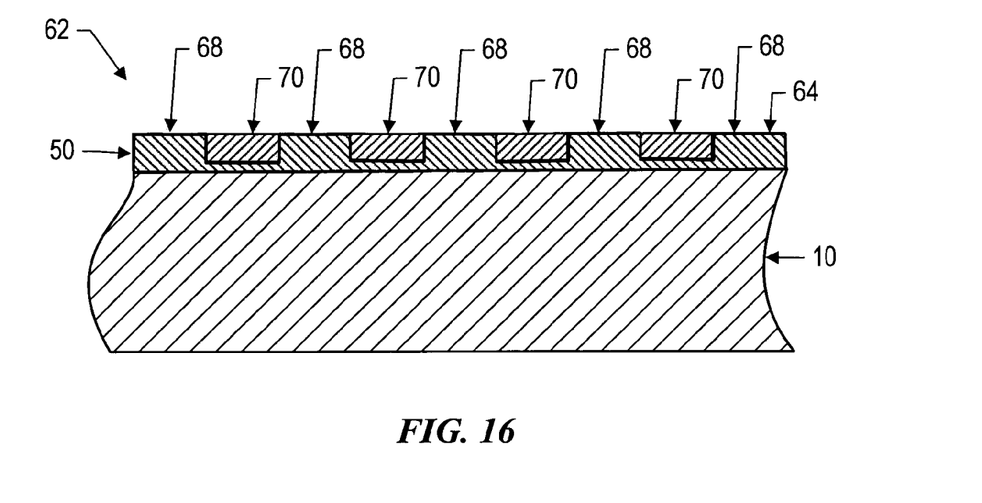
FIG. 16 is a simplified elevation view of the third multi-layered structure having a crown surface formed thereon.

Referring to FIGS. 14 and 15, multi-layered structure 62 may be treated analogously to multi-layered structure 60, shown in FIG. 8, in that a surface 66 of multi-layered structure 62 may be formed therein after contact with template 14, wherein surface 66 of multi-layered structure 62 may be analogous to surface 34 of multi-layered structure 60, shown in FIG. 8. Also, multi-layered structure 62 may be exposed to substantially the same etching process as multi-layered structure 60, shown in FIG. 8, is exposed to. Thus, surface 66 of multi-layered structure 61 is formed such that after exposure to the aforementioned etching process, surface 67 is formed therefrom, with surface 67 having a substantially planar etch signature, which is desired. Furthermore, it may be desired to form a crown surface 64 from surface 66, shown in FIG. 16, on multi-layered structure 62, wherein crown surface 64, shown in FIG. 16, is defined by an exposed surface 68 of each of protrusions 54 and upper surface of portions 70 that remain on planarization layer 21 after multi-layered structure 62 is exposed to the above-mentioned etching process.

Figure 17:
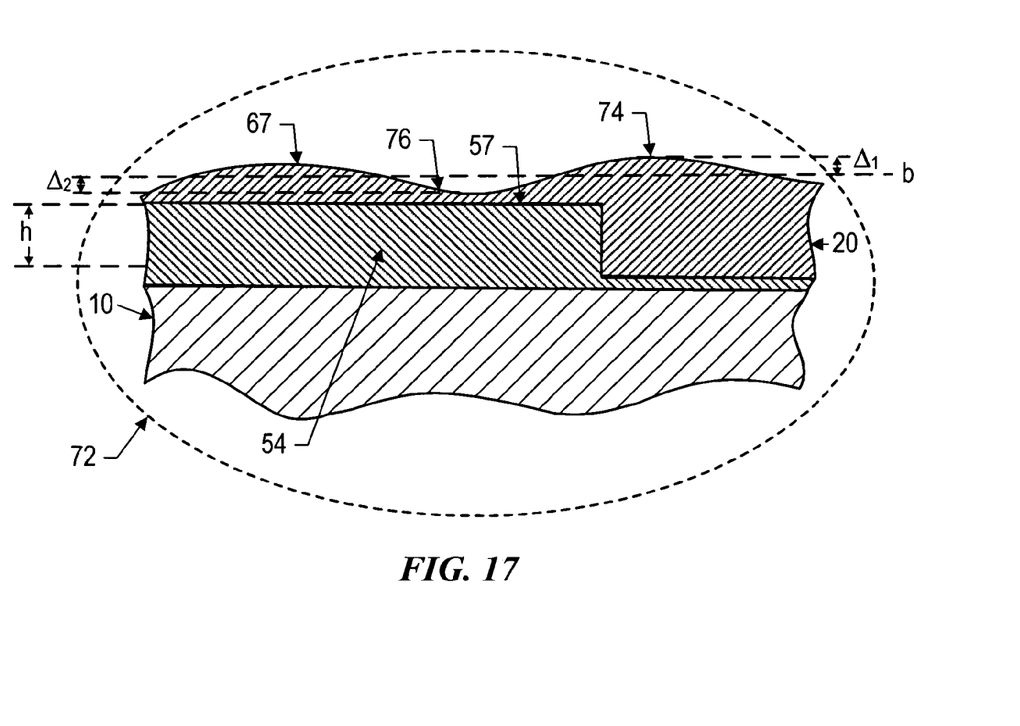
FIG. 17 is an exploded view of a region of the third multi-layered structure, shown in FIG. 15.

Referring to FIG. 17, a portion 72 of multi-layered structure 62, shown in FIG. 15, is depicted, wherein portion 72 displays a level of planarity of surface 67 that is preferred in the present invention. Surface 67 comprises a plurality of hills and valleys; however, only hill 74 and valley 76 are shown. The plurality of hills and valleys of surface 67 define an average plane of planarity, shown as plane 'b,' of surface 67. However, the plurality of hills and valleys of surface 67 may deviate from plane 'b' by differing magnitudes and wherein, for simplicity, each deviation may be defined as $\Delta_{dev}$. More specifically, a zenith of hill 74 may deviate from plane 'b' a magnitude $\Delta_1$ and a nadir of valley 76 may deviate from plane 'b' a magnitude $\Delta_2$. The values of the deviations of the plurality of hills and valleys of surface 67, $\Delta_{dev}$, from plane 'b' are a function of a step height 'h' of protrusions 54. In the present invention, a preferred level of planarity of surface 67 is defined by the equation:

$$\Delta_{dev} \leq h/N, \quad (1)$$

wherein it is desirable to have $N \geq 1$. To that end, a more preferred level of planarity of surface 67 is defined by the equation:

$$\Delta_{dev} \leq h/5 \quad (2)$$

and a most preferred level of planarity of surface 67 is defined by the equation:

$$\Delta_{dev} \leq h/10. \quad (3)$$

Figure 18:
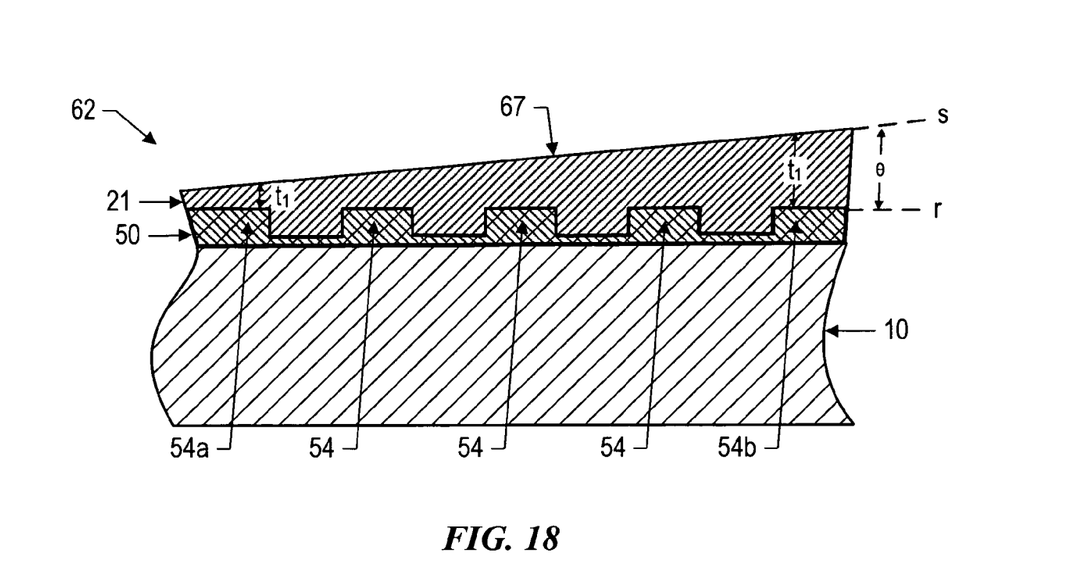
FIG. 18 is a simplified elevation view of the third multi-layered structure having a tilted surface.

Referring to FIG. 18, surface 67 of multi-layered structure 60 is shown tilted with respect to patterned layer 50. More specifically, an angle Φ is formed between a plane 'r' of the apexes of protrusions 54 and a plane 's' of surface 67. The angle Φ is formed as a result in the difference in thickness of planarization layer 21 across multi-layered structure 62. More specifically, a thickness 't$_1$' is defined between protrusion 54a and surface 67 and a thickness 't$_2$' is defined between protrusions 54b and surface 67, wherein protrusions 54a and 54b are a subset of protrusions 54. The difference in magnitudes of thicknesses 't$_1$' and 't$_2$' define a thickness variation Δ$_t$. In the present invention, it may be preferable to minimize the angle Φ such that Δ$_t$ may have a magnitude defined by the equation:

$$\Delta_t \leq h, \quad (4)$$

wherein h, shown in FIG. 17, is the aforementioned step height of protrusions 54. However, it may be more preferable to minimize the angle Φ such that Δ$_t$ may be defined by the equation:

$$\Delta_t \leq h/5, \quad (5)$$

and it may be most preferable to minimize the Φ such that Δ$_t$ may be defined by the equation:

$$\Delta_t \leq h/10, \quad (6)$$

To minimize the angle Φ, a compliant device may be employed. An exemplary embodiment for a compliant device is disclosed in U. S. patent application Ser. No. 10/858,100, filed Jun. 1, 2004 and entitled "A Compliant Device for Nano-scale Manufacturing," which is incorporated by reference in its entirety herein.

Figure 19:
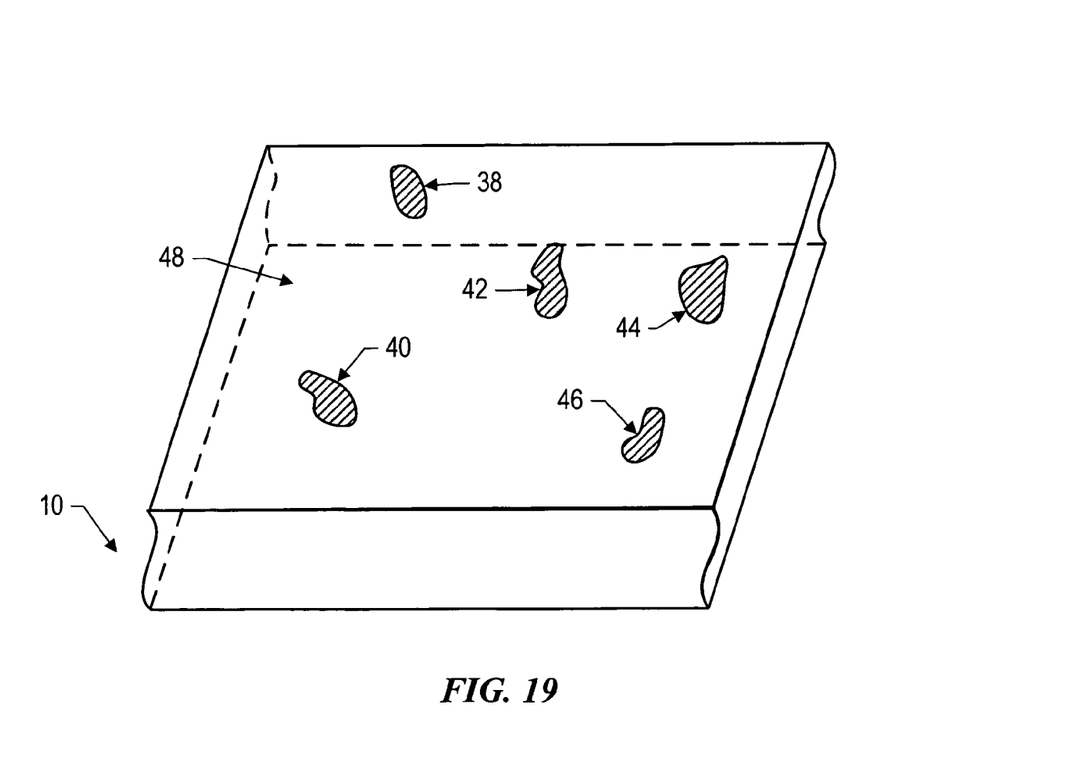
FIG. 19 is a top down view of the substrate, shown in FIG. 2, depicting regions of non-planarity.

Referring to FIGS. 2 and 19, although surface 12 of substrate 10 is shown having a substantially non-planar etch signature along a single axis, surface 12 of substrate 10 may have a substantially non-planar etch signature along two axes, wherein the two axes may be placed transverse to one another. As shown in FIG. 10, substrate 10 is shown having areas 38, 40, 42, 44, and 46 that represent a non-planar etch signature of a surface 48 of substrate 10. Areas 38, 40, 42, 44, and 46 may represent such geometrical features including, but not limited to, protrusions or pits along surface 48 of substrate 10. Areas 38, 40, 42, 44, and 46 may be a result of subjecting substrate 10 to the aforementioned etching process having differing etch rates, as mentioned above. Therefore, the above-mentioned process of compensating for differing etch rates along a single axis should apply to differing etch rates along two axis.

While this invention has been described with references to various illustrative embodiments, the description is not intended to be construed in a limiting sense. As a result various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A method of planarizing a substrate, said method comprising:
    exposing a template to an etching chemistry to form a contour therein;
    contacting a contoured layer formed on said substrate with said template, said contoured layer having a first shape associated therewith being an inverse of said contour of said template; and
    etching said contoured layer with said etching chemistry having differing etching rates across said contoured layer, with said first shape of said contoured layer compensating for said differing etching rates across said contoured layer such that a surface of said contoured layer is substantially planar upon exposure to said etching chemistry.

2. The method as recited in claim 1 wherein contacting further includes aligning said template with said substrate such that said first shape compensates for said differing etch rates.

3. The method as recited in claim 1 wherein said method further includes disposing a patterned layer between said substrate and said contoured layer, with said patterned layer comprising a plurality of protrusions having a step height associated therewith, with a first thickness being defined between a first subset of said plurality of protrusions and a surface of said contoured layer and a second thickness being defined between a second subset of said plurality of protrusions and said surface of said contoured layer, with a difference between said first thickness and said second thickness being less than said step height.

4. The method as recited in claim 1 wherein said method further includes disposing a patterned layer between said substrate and said contoured layer, with said patterned layer comprising a plurality of protrusions having a step height associated therewith, with processing said contoured layer further includes having variations in said substantially planar shape of said contoured layer less than said step height.

5. The method as recited in claim 1 wherein said method further includes disposing a patterned layer between said substrate and said contoured layer, with said patterned layer comprising a plurality of protrusions having a step height associated therewith, with processing said contoured layer further includes having variations in said substantially planar shape of said contoured layer less than a predetermined magnitude.

6. The method as recited in claim 1 wherein forming said contoured layer further includes disposing a plurality of spaced-apart droplets of an activating light curable liquid on said substrate.

7. The method as recited in claim 1 wherein forming said contoured layer further includes disposing a plurality of spaced-apart droplets of an activating light curable liquid on said substrate, with said activating light curable liquid having a viscosity of less than about 15 centipose.

8. The method as recited in claim 1 wherein forming said contoured layer further includes spin-coating a material on said substrate.

9. The method as recited in claim 1 wherein said contoured layer comprises an activating light curable liquid, with said method further including impinging activating light upon said activating light curable liquid, and forming from said activating light curable liquid, solidified material, with said activating light being selected from a group consisting essentially ultraviolet, infrared, visible, electromagnetic, and thermal.

10. The method as recited in claim 1 wherein said contoured layer comprises an activating light curable liquid, with said method further including impinging activating light upon said activating light curable liquid, and forming from said activating light curable liquid, solidified material.

11. A method of planarizing a substrate, said method comprising:
    exposing a template to an etching chemistry to form a contour therein;

contacting a contoured layer formed on said substrate with said template, said contoured layer having a plurality of regions each having a thickness associated therewith defining a first shape of said contoured layer, with said first shape being an inverse of said contour of said template; and etching said contoured layer with said etching chemistry having differing etching rates across said contoured layer, with said thickness associated with each of said plurality of regions of said first shape compensating for said differing etching rates across said contoured layer such that a surface of said contoured layer is substantially planar upon exposure to said etching chemistry.

12. The method as recited in claim 11 wherein said method further includes disposing a patterned layer between said substrate and said contoured layer, with said patterned layer comprising a plurality of protrusions having a step height associated therewith, with a first thickness being defined between a first subset of said plurality of protrusions and a surface of said contoured layer and a second thickness being defined between a second subset of said plurality of protrusions and said surface of said contoured layer, with a difference between said first thickness and said second thickness being less than said step height.

13. The method as recited in claim 12 wherein forming said contoured layer further includes having variations in said substantially planar shape of said contoured layer less than said step height.

14. The method as recited in claim 13 wherein said contoured layer comprises an activating light curable liquid, with said method further including impinging activating light upon said activating light curable liquid, and forming from said activating light curable liquid, solidified material, with said activating light being selected from a group consisting essential of ultraviolet, infrared, visible, electromagnetic, and thermal.

15. The method as recited in claim 12 wherein forming said contoured layer further includes having variations in said substantially planar shape of said contoured layer less than a predetermined magnitude.

16. A method of planarizing a substrate having an imprinting layer disposed thereon, said method comprising:

exposing a template to an etching chemistry to form a contour therein;

contacting said imprinting layer with said template to form a contoured region having a first shape associated therewith, said first shape being an inverse of said contour; and etching said contoured region with said etching chemistry having differing etching rates across said contoured region, with said first shape of said contoured layer compensating for said differing etching rates across said contoured layer such that a surface of said contoured layer is substantially planar upon exposure to said etching chemistry.

17. The method as recited in claim 16 wherein said method further includes providing said contoured region with a plurality of regions each having a thickness associated therewith, with said thickness associated with each of said plurality of regions compensating for said differing etch rates.

18. The method as recited in claim 16 wherein said method further includes disposing a patterned layer between said substrate and said contoured region, with said patterned layer comprising a plurality of protrusions having a step height associated therewith, with a first thickness being defined between a first subset of said plurality of protrusions and a surface of said contoured region and a second thickness being defined between a second subset of said plurality of protrusions and said surface of said contoured region, with a difference between said first thickness and said second thickness being less than said step height.

19. The method as recited in claim 16 wherein said method further includes disposing a patterned layer between said substrate and said contoured region, with said patterned layer comprising a plurality of protrusions having a step height associated therewith, with etching said contoured region further includes having variations in said substantially planar shape of said contoured region less than said step height.

20. The method as recited in claim 16 wherein said method further includes disposing a patterned layer between said substrate and said contoured region, with said patterned layer comprising a plurality of protrusions having a step height associated therewith, with etching said contoured region further includes having variations in said substantially planar shape of said contoured region less than a predetermined magnitude.

21. The method as recited in claim 16 wherein forming said contoured region further includes disposing a plurality of spaced-apart droplets of an activating light curable liquid on said substrate.

22. The method as recited in claim 16 wherein forming said contoured region further includes disposing a plurality of spaced-apart droplets of an activating light curable liquid on said substrate, with said activating light curable liquid having a viscosity of less than about 15 centipose.

23. The method as recited in claim 16 wherein said method further includes spin-coating a material on said substrate to form said imprinting layer.

24. The method as recited in claim 16 wherein said imprinting layer comprises an activating light curable liquid, with said method further including impinging activating light upon said activating light curable liquid, and forming from said activating light curable liquid, solidified material, with said activating light being selected from a group consisting essentially ultraviolet, infrared, visible, electromagnetic, and thermal.

25. A method of planarizing a substrate having an imprinting layer disposed thereon, said method comprising:

contacting said imprinting layer with a template to form a contoured region having a first shape associated therewith; and etching said contoured region with an etching chemistry having differing etching rates across said contoured region, with said first shape compensating for said differing etching rates such that upon exposure to said etching chemistry, said contoured region comprises a substantially planar shape; and wherein said template being exposed to said etching chemistry to form the contour therein, with said first shape being an inverse of said contour.

26. A method of planarizing a substrate, said method comprising:

exposing a template to an etching chemistry to form a contour therein;

forming, on said substrate, a contoured layer having a first shape associated therewith;

contacting said contoured layer with said template, with said first shape being an inverse of said contour of said template; and processing said contoured layer with said etching chemistry having differing etch rates across said contoured layer, with said first shape compensating for variations in said processing such that upon processing said contoured layer, said contoured layer comprises a substantially planar shape.

27. A method of planarizing a substrate, said method comprising:

exposing a template to an etching chemistry to form a contour therein:

forming, on said substrate, a contoured layer having a first shape associated therewith;

contacting said contoured layer with said template forming said first shape therein; and processing said contoured layer with said etching chemistry having differing etch rates across said contoured layer, with said first shape compensating for variations in said processing such that upon processing said contoured layer, said contoured layer comprises a substantially planar shape, said contacting further including comprising aligning said template with said substrate such that said first shape compensates for said differing etch rates.

28. A method of planarizing a substrate, said method comprising:

exposing a template to an etching chemistry to form a contour therein;

forming, on said substrate, a contoured layer having a first shape associated therewith;

contacting said contoured layer with said template, with said first shape being an inverse of a contour of said template; and etching said contoured layer with said etching chemistry having differing etching rates across said contoured layer, with said first shape compensating for said differing etching rates such that upon exposure to said etching chemistry, said contoured layer comprises a substantially planar shape.

29. The method as recited in claim 28 wherein forming said contoured layer further includes providing said contoured layer with a plurality of regions each having a thickness associated therewith, with said thickness associated with each of said plurality of regions compensating for said differing etch rates.

30. The method as recited in claim 29 wherein said method further includes disposing a patterned layer between said substrate and said contoured layer, with said patterned layer comprising a plurality of protrusions having a step height associated therewith, with a first thickness being defined between a first subset of said plurality of protrusions and a surface of said contoured layer and a second thickness being defined between a second subset of said plurality of protrusions and said surface of said contoured layer, with a difference between said first thickness and said second thickness being less than said step height.

31. The method as recited in claim 30 wherein forming said contoured layer further includes having variations in said substantially planar shape of said contoured layer less than said step height.

32. The method as recited in claim 31 wherein said contoured layer comprises an activating light curable liquid, with said method further including impinging activating light upon said activating light curable liquid, and forming from said activating light curable liquid, solidified material, with said activating light being selected from a group consisting essential of ultraviolet, infrared, visible, electromagnetic, and thermal.

33. The method as recited in claim 30 wherein forming said contoured layer further includes having variations in said substantially planar shape of said contoured layer less than a predetermined magnitude.

* * * * *